(12) United States Patent
Tan et al.

(10) Patent No.: US 8,094,431 B2
(45) Date of Patent: Jan. 10, 2012

(54) METHODS FOR IMPROVING THE DIELECTRIC PROPERTIES OF A POLYMER, AND RELATED ARTICLES AND DEVICES

(75) Inventors: Daniel Qi Tan, Rexford, NY (US); Patricia Chapman Irwin, Altamont, NY (US); George Theodore Dalakos, Niskayuna, NY (US); Yang Cao, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 459 days.

(21) Appl. No.: 12/414,949

(22) Filed: Mar. 31, 2009

(65) Prior Publication Data
US 2010/0246094 A1    Sep. 30, 2010

(51) Int. Cl.
*H01G 4/06* (2006.01)

(52) U.S. Cl. ........ 361/313; 361/311; 361/312; 361/502; 361/503

(58) Field of Classification Search .................. 361/311, 361/312, 323, 321.4, 321.5, 313, 502–503; 501/134–139
See application file for complete search history.

(56) References Cited

U.S. PATENT DOCUMENTS

| | | | | |
|---|---|---|---|---|
| 5,305,178 A | * | 4/1994 | Binder et al. | 361/323 |
| 5,439,984 A | | 8/1995 | Kodama et al. | |
| 5,636,100 A | * | 6/1997 | Zheng et al. | 361/312 |
| 5,844,770 A | * | 12/1998 | Fries-Carr et al. | 361/301.5 |
| 6,426,861 B1 | | 7/2002 | Munshi | |
| 6,721,162 B2 | * | 4/2004 | Kumar et al. | 361/234 |
| 6,849,306 B2 | | 2/2005 | Fukuda et al. | |
| 7,488,507 B2 | | 2/2009 | Kubacki | |
| 2008/0123250 A1 | | 5/2008 | Tan et al. | |

FOREIGN PATENT DOCUMENTS

| | | |
|---|---|---|
| EP | 1852897 A1 | 11/2007 |
| WO | 9314881 A | 8/1993 |
| WO | 9405024 A1 | 3/1994 |

OTHER PUBLICATIONS

D. M. Svirachev, N. A. Tabaliov; Plasma Treatment of Polymer Surfaces in Different Gases; Bulg. J. Phys. 32 (2005) 22-33.
Michael Binder, William L. Wade Jr., Peter Cygan, T. Richard Jow, Robert J. Mammone; Breakdown Voltages of Commercial Polymer Films Following Exposure to Various Gas Plasmas; IEEE Transactions on Electrical Insulation; vol. 27 No. 2, Apr. 1992.
Kyung-Bum Lim, Do-Hyun You, Yoon-Sun Kim, Myung-Hwan Hwang, Neung-Heon Lee, Duck-Chool Lee; Surface Modification of Polymer Insulator by Plasma Surface Treatment; Proceedings of the 7th International Conference on Properties and Applications of Dielectric Materials Jun. 1-5, 2003 Nagoya; pp. 642-645.

* cited by examiner

*Primary Examiner* — Nguyen Ha
*Assistant Examiner* — Hung Dang
(74) *Attorney, Agent, or Firm* — Francis T. Coppa

(57) ABSTRACT

In one aspect of the present invention, a method for increasing the dielectric breakdown strength of a polymer is described. The method comprises providing the polymer and contacting a surface of the polymer in a reaction chamber with a gas plasma, under specified plasma conditions. The polymer is selected from the group consisting of a polymer having a glass transition temperature of at least about 150° C., and a polymer composite comprising at least one inorganic constituent. The contact with the gas plasma is carried out for a period of time sufficient to incorporate additional chemical functionality into a surface region of the polymer film, to provide a treated polymer. Also provided are an article and method of manufacture.

21 Claims, 3 Drawing Sheets

METHODS FOR IMPROVING THE DIELECTRIC PROPERTIES OF A POLYMER, AND RELATED ARTICLES AND DEVICES

BACKGROUND

The invention relates generally to a method of treating a polymer to increase its dielectric properties, and to an article comprising a layer of the treated polymer.

Polymers with high resistivity, high permittivity, low dissipation factors and high electric field breakdown strengths (Vb) have important applications as dielectrics in electronic devices, such as a capacitor. The electronic industry is cost- and performance-driven, and constantly increasing demands are made on materials to lower cost, and improve their reliability and performance. Polymer based devices have long been of interest because manufacturing technologies associated with extrusion or solution casting of polymer films can be readily combined with thin film metallization techniques, to yield devices that are flexible and economical, and which can be manufactured into very large electronic devices.

Polymer films such as polycarbonate, polypropylene and polyester have been the insulating media of choice for fabrication of thin film electrostatic capacitors for operation in the kilovolt range. Polymer based capacitors have been the capacitor of choice for many power electronics and pulse power applications, because of their inherent low dielectric losses, excellent high frequency response, low dissipation factor (DF), low equivalent series resistance (ESR), and high voltage capabilities. Polymer based capacitors have no capacitance coefficient with applied voltage, and metallic migration or leaching does not occur, as observed in the case of ceramic based capacitors.

Over the last decade, significant increases in capacitor reliability have been achieved through a combination of advanced manufacturing techniques and new materials. In addition, polymer-based electronic devices, such as a capacitor, would offer compact capacitor structure, self-clearing capability, longer lifetime, and higher energy density. These advantages, coupled with the advantage of reduced size, simplicity, and cost of manufacturing, enable the wide use of these polymer based capacitors in the power electronics industry.

Polymer based capacitors are lightweight and compact and, hence, are attractive for various land based and space applications. However, most of the dielectric polymers are characterized by low energy densities (<5 J/cc), and/or have low breakdown strength (<450 kV/mm), which may limit the operating voltage of the capacitor. Other disadvantages are sometimes associated with these types of capacitors as well, relating to thermal stability and reduced lifetime, for example. In order to achieve high energy density, it may be desirable to have both high dielectric constant and high breakdown strength. A trade-off between these two properties may not be advantageous. Most dielectric polymers that exhibit high breakdown strength have a relatively low dielectric constant.

Therefore, it is important to identify a material with a considerably high dielectric constant and relatively high breakdown strength. There is a need for polymer materials that would address the aforementioned problems and meet the current demands of electronics industry applications. Further, there is a need for simpler and versatile methods to prepare high quality polymer materials for use in polymer based electronic devices.

BRIEF DESCRIPTION

One aspect the present invention provides a method for increasing the dielectric breakdown strength of a polymer, which includes providing the polymer and contacting a surface of the polymer with a gas plasma, in a reaction chamber. The polymer is selected from the group consisting of a polymer having a glass transition temperature of at least about 150° C., and a polymer composite comprising at least one inorganic constituent. The gas plasma is formed from at least one feedstock gas selected from the group consisting of oxygen, carbon tetrafluoride, nitrogen, air, ammonia, hydrogen, argon and helium. The feedstock gas is directed to the surface of the polymer at a flow rate of at least about 1 standard cubic centimeter per minute to about 10000 standard cubic centimeters per minute. The contact with the gas plasma is carried out for a period of time sufficient to incorporate additional chemical functionality into a surface region of the polymer film, to provide a treated polymer. In this manner, the treated polymer has a dielectric breakdown strength, which is at least 0.1 percent (%) greater than the dielectric breakdown strength of an untreated polymer.

Another aspect of the present invention provides an article having an energy density in the range from about 3 Joules per cubic centimeter to about 50 Joules per cubic centimeter. The article is made by the method comprising providing the polymer; and contacting a surface of the polymer in a reaction chamber with a gas plasma. The polymer is selected from the group consisting of a polymer having a glass transition temperature of at least about 150° C., and a polymer composite comprising at least one inorganic constituent. The gas plasma is usually formed from at least one feedstock gas selected from the group consisting of oxygen, carbon tetrafluoride, nitrogen, air, ammonia, hydrogen, argon and helium. In most embodiments, the feedstock gas is directed to the surface of the polymer at a flow rate of at least about 1 standard cubic centimeter per minute. The contact with the gas plasma is carried out for a period of time sufficient to incorporate additional chemical functionality into a surface region of the polymer film, to provide a treated polymer. The treated polymer has a dielectric breakdown strength, which is at least about 0.1 percent (%) greater than the dielectric breakdown strength of an untreated polymer.

BRIEF DESCRIPTION OF THE DRAWINGS

These and other features, aspects, and advantages of the present invention will become better understood when the following detailed description is read with reference to the accompanying drawings, in which like characters represent like parts throughout the drawings, wherein.

DETAILED DESCRIPTION

Figure 1:
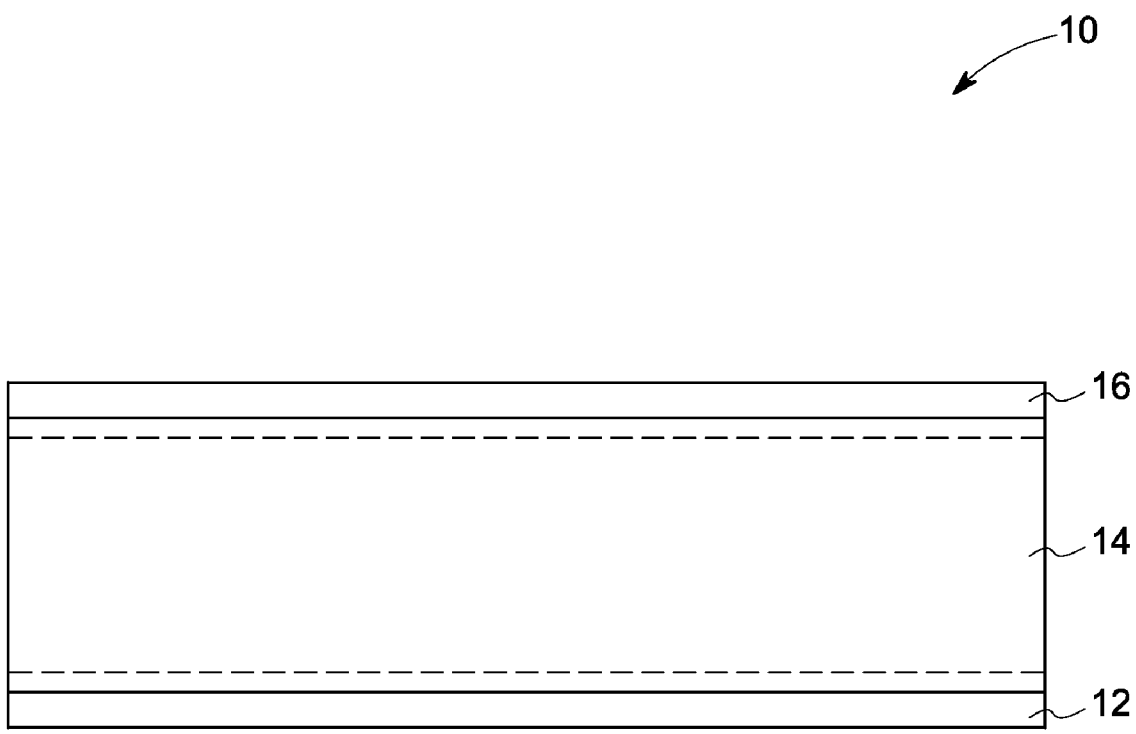
FIG. 1 is a cross-sectional view of a portion of a polymer film capacitor, illustrating a plasma-treated surface of a dielectric layer in accordance with one aspect of the invention.

While only certain features of the invention have been illustrated and described herein, many modifications and changes will occur to those skilled in the art. It is, therefore, to be understood that the appended claims are intended to cover all such modifications and changes as fall within the true spirit of the invention. In the specification and claims, reference will be made to a number of terms, which have the following meanings.

The singular forms "a", "an" and "the" include plural referents unless the context clearly dictates otherwise. Approximating language, as used herein throughout the specification and claims, may be applied to modify any quantitative representation that could permissibly vary without resulting in a change in the basic function to which it is related. Accordingly, a value modified by a term such as "about" is not to be limited to the precise value specified. In some instances, the approximating language may correspond to the precision of an instrument for measuring the value. Similarly, "free" may be used in combination with a term, and may include an insubstantial number, or trace amounts, while still being considered free of the modified term.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable, or suitable. For example, in some circumstances an event or capacity can be expected, while in other circumstances the event or capacity cannot occur—this distinction is captured by the terms "may" and "may be".

"Optional" or "optionally" means that the subsequently described event or circumstance may or may not occur, and that the description includes instances where the event occurs and instances where it does not.

Some of the dielectric properties considered herein are dielectric constant, and breakdown strength. The "dielectric constant" of a dielectric material is a ratio of the capacitance of a capacitor, in which the space between and around the electrodes is filled with the dielectric, to the capacitance of the same configuration of electrodes in a vacuum. As used herein, "breakdown strength" refers to a measure of the dielectric breakdown resistance of a polymer (dielectric) material under an applied AC or DC voltage. The applied voltage prior to breakdown is divided by the thickness of the dielectric (polymer) material to provide the breakdown strength value. It is generally measured in units of potential difference over units of length, such as kilovolts per millimeter (kV/mm). As used herein, the term "high temperatures" refers to temperatures above about 100 degrees Celsius (° C.), unless otherwise indicated.

As noted, in one embodiment, the present invention provides a method for increasing the dielectric breakdown strength of a polymer, the method comprising: providing the polymer; and contacting a surface of the polymer in a reaction chamber with a gas plasma formed from at least one feedstock gas. Non-limiting examples of suitable feedstock gases are oxygen, ozone, carbon tetrafluoride, nitrogen, air, ammonia, hydrogen, argon, nitrous oxide, sulfur hexafluoride, chlorine, boron trichloride, helium, and various combinations thereof. In one embodiment, the feedstock gas comprises at least about 50% air. In another embodiment, the feedstock gas comprises at least about 75% air. The feedstock gas is directed to the surface of the polymer at a flow rate of at least about 1 standard cubic centimeter per minute; to about 10000 standard cubic centimeters per minute. The contact with the gas plasma is carried out for a period of time sufficient to incorporate additional chemical functionality into a surface region of the polymer film, to provide a treated polymer. The treated polymer has a dielectric breakdown strength, which is at least 0.1 percent (%) greater than the dielectric breakdown strength of an untreated polymer.

In one embodiment, the polymer has a glass transition temperature of at least about 150° C., and in some specific embodiments, at least about 200° C. A variety of polymers exhibit this property, and are often referred to as "high temperature polymers". Non-limiting examples include polyetherimides, cyano modified polyetherimides, polysulfones, polyvinyledinedifluorides, polyvinylidenehexafluorides, polyphenylenesulfides, polyimides, polyarylethers, polyethersulfones, cyanoethyl cellulose, siloxane imide polymers, and various copolymers, which contain any of the foregoing. (Those skilled in the art understand that some of the listed polymers may be available in grades which don't meet the temperature criteria for this embodiment). Moreover, many physical blends of the various polymers may also be used. In those instances, it is preferred that each of the individual polymers would have a glass transition temperature of at least about 150° C.

In another embodiment, the polymer is a polymer composite. As used herein, the term "composite" is meant to refer to a material made of more than one component. Thus, in this embodiment, the polymer or copolymer contains at least one inorganic constituent e.g., a filler material. The polymer can be selected from the higher-temperature polymers set forth above, or can be a lower-temperature polymer (or copolymer or blend), i.e., one having a glass transition temperature of less than about 150° C. Examples of such polymers include polypropylene, polyesters, polycarbonates, polyethylene, polyphenylene sulfide, polyether, polyvinylidene difluoride, polyvinylchloride, or copolymers therefrom. Non-limiting examples of the inorganic constituents include siliceous materials, carbonaceous materials, metal hydrates, metal oxides, metal borides, and metal nitrides. In one embodiment, the inorganic constituent is at least one selected from powdered ferroelectric materials, barium titanate, boron nitride, aluminum oxide, strontium titanate, barium strontium titanate, alumina, titania, zirconia, magnesia, zinc oxide, cesium oxide, yttria, silica, lead zirconate, and lead zirconate titanate. The inorganic constituent can be in a variety of shapes or forms, e.g., particulates, fibers, platelets, whiskers, rods, or a combination of two or more of the foregoing. In one embodiment, the inorganic constituent (e.g., a particle) may be used in a form with a specified particle size, particle size distribution, average particle surface area, particle shape, and particle cross-sectional geometry. (Other specifications may also be adhered to, depending on the type of constituent, e.g., an aspect ratio in the case of whiskers or rods).

In one embodiment, the inorganic constituent may be present in the polymer composite in an amount from about 1 weight percent to about 80 weight percent based on the total weight of the polymer composite. In another embodiment, the inorganic constituent may be present in an amount from about 5 weight percent to about 60 weight percent based on the total weight of the polymer composite. In yet another embodiment, the inorganic constituent may be present in an amount from about 10 weight percent to about 50 weight percent based on the total weight of the polymer composite.

In one embodiment, contact of the polymer surface with the gas plasma is carried out in a reaction chamber under conditions suitable for a plasma treatment. As mentioned herein, plasma treatment on a surface refers to a plasma reaction that either results in modification of a molecular structure, or atomic substitution. For example, contacting a surface of the polymer with a gas plasma of a fluorinated species such as carbon tetrafluoride ($CF_4$), induces substitution of hydrogen atoms in the polymer surface with fluorine atoms. This results in the creation of a fluorinated structure that can result in better properties for the polymer, for example, at least partially functionalizing the surface of the polymer, as compared to the untreated polymer. In a non-limiting example, the plasma treatment may include techniques such as corona treatment, gas atmosphere plasma, flame plasma, atmospheric plasma, low pressure plasma, vacuum plasma, glow-discharge plasma, plasma etching, chemical vapor deposition, and the like. In one embodiment, the contact with the plasma is carried out using a chemical vapor deposition (CVD) technique, which is known in the art. A particular type of CVD technique preferred for some embodiments is plasma enhanced chemical vapor deposition (PECVD), which is also familiar to those in the art.

In one embodiment, the gas plasma is formed from at least one feedstock gas selected from the group consisting of oxygen, ozone, carbon tetrafluoride, nitrogen, air, ammonia, hydrogen, argon, nitrous oxide, sulfur hexafluoride, chlorine, $BCl_3$, and helium. In another embodiment, the gas plasma comprises air. In one embodiment, the feedstock gas is directed to a surface of the polymer at a flow rate in a range from about 1 standard cubic centimeter per minute to about 10000 standard cubic centimeters per minute. In another embodiment, the flow rate is in a range from about 200 standard cubic centimeters per minute to about 7000 standard cubic centimeters per minute. In yet another embodiment, the flow rate is in a range from about 300 standard cubic centimeters per minute to about 3000 standard cubic centimeters per minute.

In one embodiment, the contact of the polymer surface with the gas plasma is carried out at a pressure in a range from about 0.1 milli Torr to about 15 Torr. In another embodiment, the contact of the polymer surface is carried out at a pressure in a range from about 50 milli Torr to about 10 Torr. In yet another embodiment, the contact of the polymer surface is carried out at a pressure in a range from about 200 milli Torr to about 2 Torr.

In one embodiment, the contact of the polymer surface in a reaction chamber with a gas plasma is carried out at a temperature in the range from about 10° C. to about 200° C. In another embodiment, the contact of the polymer surface in a reaction chamber with a gas plasma is carried out at a temperature in the range from about 25° C. to about 100° C.

In one embodiment, the contact of the polymer surface in a reaction chamber with a gas plasma is carried out for a duration in the range from about 1 second to about 30 minutes. In another embodiment, the contact of the polymer surface in a reaction chamber with a gas plasma is carried out for a duration in the range from about 10 seconds to about 10 minutes. In yet another embodiment, the contact of the polymer surface in a reaction chamber with a gas plasma is carried out for a duration in the range from about 20 seconds to about 60 seconds. The most appropriate treatment time (as well as plasma temperature, described above), will depend in part on the particular polymer employed.

In one embodiment, the gas plasma has an electron density in a range from about $1 \times 10^9$ $cm^{-3}$ to about $1 \times 10^{15}$ $cm^{-3}$ at an electron temperature in a range from about 0.1 electron Volt to about 10 electron Volts, within the gas plasma generation region. In one embodiment, the surface region of the polymer film extends from the surface of the polymer to a depth of at least about 1 nanometer, and in some instances, to a depth of at least about 10 microns.

In one embodiment, the treated polymer layer has a dielectric breakdown strength, which is at least about 0.1 percent (%) greater than the dielectric breakdown strength of an untreated polymer. In another embodiment, the treated polymer layer has a dielectric breakdown strength, which is at least about 5 percent (%) greater than the dielectric breakdown strength of an untreated polymer.

In one embodiment, an article made from the above method is provided. The article can include the polymer (e.g., one or more layers formed partially or entirely from the polymer), treated by employing the above-described technique. Non-limiting examples of the article include a capacitor, an insulation film/layer, or insulating tapes. As an example, the tapes can be used as part of the insulation system for devices such as rotating machinery, transformers, cables, and other electrical devices. In one embodiment, the article is a capacitor. In one embodiment, the article has a length in the range from about 10 centimeters to about 10,000 centimeters, and a width in a range from about 10 centimeters to about 200 centimeters. In one embodiment, the article has a thickness in a range from about 1 micrometer to about 20 micrometers.

In another embodiment, the treated polymer is a dielectric layer within a capacitor. In one embodiment, the thickness of the dielectric layer is in a range from about 0.5 micrometer to about 50 micrometers. In one embodiment, the dielectric layer can operate at a temperature in a range from about −50° C. to about 250° C. In another embodiment, the dielectric layer has a breakdown voltage in a range from about 300 kilovolts per millimeter to about 700 kilovolts per millimeter.

In one embodiment, the article includes a treated polymer having an energy density in the range from about 3 Joules per cubic centimeter to about 50 Joules per cubic centimeter. In another embodiment, the article includes a treated polymer having an energy density in the range from about 10 Joules per cubic centimeter to about 20 Joules per cubic centimeter.

In one embodiment, the polymer treated by the above method may exhibit a variety of enhanced properties, as compared to an untreated polymer. Examples of such properties include: higher dielectric constants; increased dielectric breakdown voltage, reduced surface defects, increased thermal stability, and increased corona breakdown resistance. In another embodiment, a polymer composite which includes at least one inorganic constituent, and which is treated according to one of the embodiments described herein, exhibits good thermal conductivity (as compared to an untreated, inorganic-containing composite), and may be suitable for a variety of end use applications.

In the prior art, surface defects have caused a scattering of breakdown voltages in a dielectric, resulting in varying breakdown voltages at various locations in an article comprising the polymer film. As one example, a capacitor comprising the polymer film as a dielectric layer could exhibit various surface defects, leading to a lowering of the overall breakdown voltage of the capacitor. Plasma treatment of a surface of the polymer film as described hereinabove provides greater uniformity in a surface structure, thus reducing surface defects. This leads to a narrower breakdown voltage range and consequently, to enhancement and extension of the lifetime of the article. Further, corona resistance, i.e., a measure of the time that a dielectric in an article would withstand a specified level of ionization without resulting in complete breakdown of the dielectric, can be increased by such surface treatment. This directly results in an extended lifetime of the article.

In one embodiment, the treated polymer layer of the present invention may be applied to a substrate (such as a component of a capacitor) in several ways known to one skilled in the art. Non-limiting examples of coating processes include spin coating, dip coating, brush painting, solvent casting, and chemical vapor deposition.

FIG. 1 represents a cross-sectional view of a portion of a polymer film capacitor 10 in accordance with the invention. The polymer film capacitor 10 includes an electrode 12, for example a cathode, upon which a dielectric layer 14 is disposed. In one example, the dielectric layer 14 is a polyetherimide film, including a plasma treated surface 16 opposite to the electrode 12.

As generally described above, an embodiment of this invention is directed to an article, such as a capacitor, having dimensions of about 10 cm to about 10,000 cm in length, about 10 cm to about 200 cm in width, and about 1 micron to about 20 microns in thickness. The article has an energy density in the range of about 3 Joules per cubic centimeter to about 50 Joules per cubic centimeter, and is formed at least in part from one of two classes of polymeric materials: (I) at least one polymer having a glass transition temperature of at least about 150° C.; or (II) a polymer composite containing at least one inorganic constituent. Moreover, the article contains at least one surface with a surface region which comprises chemical functionality which is different from chemical functionality present in the polymer or polymer composite. In other words, the additional, "different" chemical functionality results from the use of the gas plasma treatment of the polymer, as described in this disclosure. Such functionality is distinct from the typical bonding and functionality present within or between chains, monomers, or "mer" units in conventional polymers. The presence of this functionality—especially in articles of these dimensions—provides an enhancement in dielectric breakdown strength, e.g., an enhancement of at least about 0.1%, as compared to similar or identical articles, which do not contain this additional chemical functionality. As mentioned above, devices or materials with the enhanced breakdown strength can be very useful in a variety of demanding electronics industry applications.

EXAMPLES

The following examples illustrate methods and embodiments in accordance with the invention, and as such, should not be construed as imposing limitations upon the claims.

Unless specified otherwise, all ingredients may be commercially available from such common chemical suppliers as Alpha Aesar, Inc. (Ward Hill, Mass.), Sigma Aldrich (St. Louis, Mo.), Spectrum Chemical Mfg. Corp. (Gardena, Calif.), and the like.

A thin film polyetherimide polymer (Ultem® polymer from SABIC Innovative Plastics), 7-15 mil (0.018-0.038 cm) thick, was surface treated at various processing times such as 10 seconds and 2 minutes, in a Plasma Therm 790 SLR capacitively coupled Reactive Ion Etching (RIE) system. The vacuum system consisted of two circular horizontal aluminum electrodes of 11 inches (27.94 cm) in diameter, separated by an approximate 1-2 inch (2.5 cm to 5.0 cm) gap. The gap functioned as the plasma reaction zone. The flat bottom electrode served as the placeholder for the samples that were processed. The top electrode was perforated with small ca. 1 mm diameter holes in a showerhead configuration. Process gases were introduced inside the reaction zone through the holes. The reactor was operated at pressures of 0.05-2 Torr, which were set through an automated throttle valve. The RF power applied to either the top or bottom electrode was around 500 W. When the top electrode is powered, the configuration is referred to as 'PE' mode. When the bottom electrode is powered, the configuration is referred to as 'RIE' mode. The electrodes were heated to 100° C., but had been set to a constant of about 25° C.

Samples to be treated were placed on the bottom electrode and taped flat to the bottom electrode. (They may also be placed in a rigid frame and stretched tight). The reactor was then pumped down to a pressure of about 1 mTorr for 5 min, to evacuate all air from the system. Gases were then flowed through the reactor, and the throttle valve was adjusted to force the system pressure to the set point of 100 mTorr to about 700 mTorr. The system pressure was constantly adjusted in real time to maintain a constant value of about 200 mTorr to about 700 mTorr. Following the pressure-adjustment, the RF power was applied to the top plate for a period of 10 to about 60 seconds. (It should be noted that the RF power takes about 5-10 seconds to ignite. This pre-ignition time can be added to the overall process time for shorter runs, e.g., less than about 30 sec). The RF power was then terminated, and the throttle valve was opened, so that the system reached the base pressure. The reactor was vented, and the samples were removed.

The treated samples were tested for electric breakdown strength in accordance with ASTM D 3755. Sample thickness was measured optically using a Filmetrics™ Thin Film Measurement system. Typically, 20 points were measured to obtain a statistically significant average breakdown strength value. Ambient relative humidity (%) and temperature were recorded for each sample. The samples were immersed in Clearco™ STO-50 transformer oil (Dimethyl Polysiloxane). A positive DC voltage was applied automatically at a 500 V/s rate of rise. The top electrode was a ¼ inch (0.64 cm) stainless steel ball bearing electrode, and the ground electrode was a 2.00 inches (5.1 cm) copper Rogovski electrode.

Figure 2:
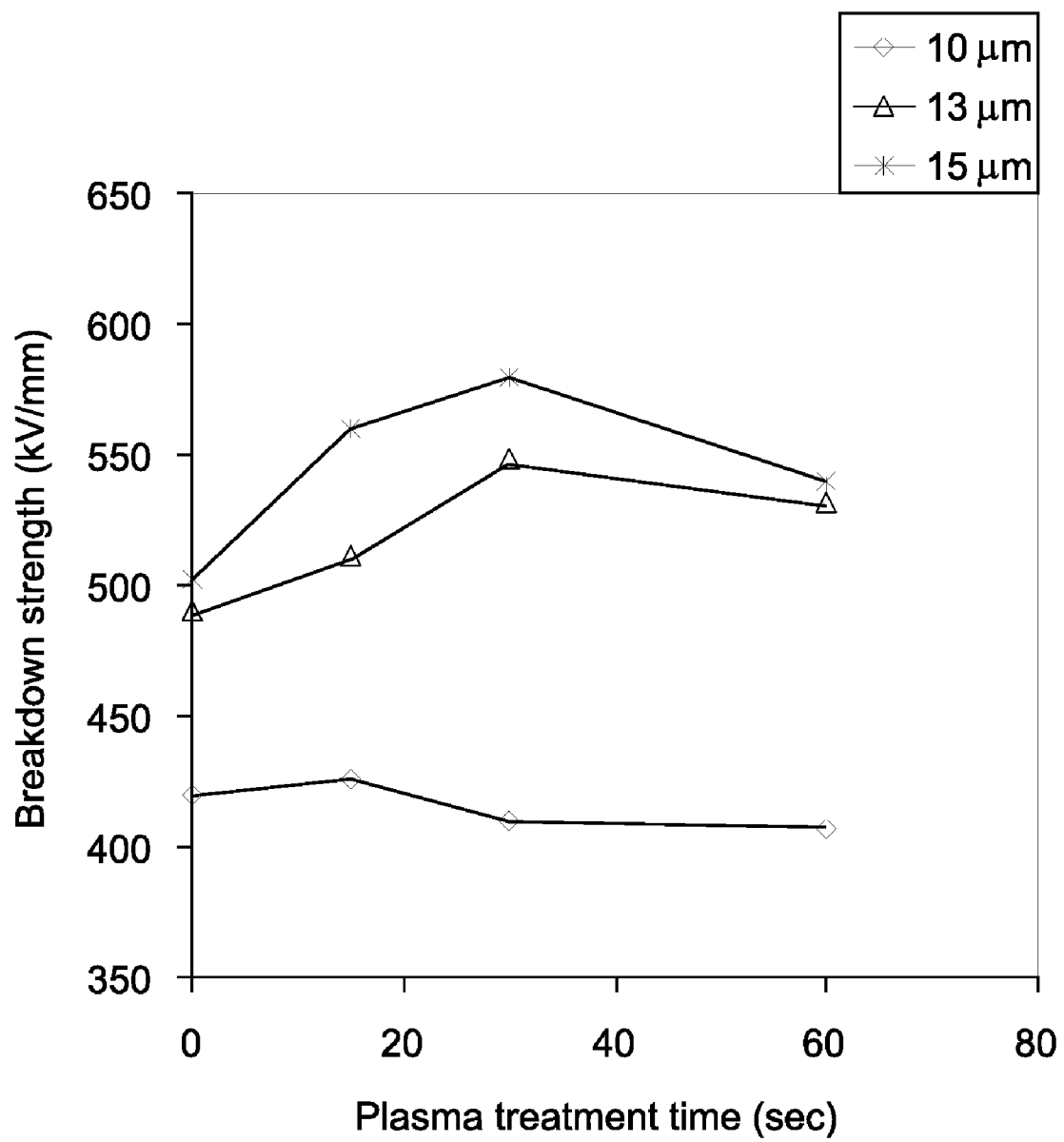
FIG. 2 is a plot of plasma contact time versus breakdown strength, in accordance with one aspect of the invention.

FIG. 2 data shows the breakdown strength in kV/mm of plasma treated PEI sheets of different thickness as a function of treatment time for thicker PEI substrates. Thin polyetherimide sheets (Ultem® polymer from SABIC Innovative Plastics) of three thicknesses (10, 13, 15 um) were plasma treated using $CF_4$ gas, employing the process described above. The time-dependence of the plasma treatment time on the breakdown strength of the treated samples was studied. Samples were loaded into the plasma treatment chamber one sample at a time. The chamber was pumped down, and after reaching base pressure, the plasma source was ignited and turned off after a set amount of time. Other plasma parameters that were held constant during the experiments: the $CF_4$ gas was flowed through the reactor at a flow rate of about 250 Standard cubic centimeters per minute. The RF power of about 250 watts was applied to the bottom electrode in an RIE mode. The electrodes were heated to 100° C., but had been set to a constant of about 25° C. and the wall temperature. The system pressure was maintained at 100 mTorr.

The plasma treatment for each polyetherimide thickness was carried out for durations of 15, 30, and 60 seconds. Each of the samples was then tested for breakdown strength as outlined above. Comparative data was obtained by having one untreated sample for each polyetherimide thickness. The measured data is plotted in FIG. 2.

As observed from FIG. 2, the polyetherimide sheet of 10 micrometer thickness exhibits relatively less enhancement in breakdown strength after plasma treatment. However, an enhancement in the breakdown strength (i.e., a change in the plasma treated samples versus the untreated samples) for the samples of 13 micrometer thickness and 15 micrometer thickness occurred after a plasma-treatment time of about 30 seconds. For these particular samples, longer plasma treatment times, such as 60 seconds, did not result in any improvement in breakdown strength. The time-dependence for maximum improvement in breakdown strength may differ in the case of other polymer materials, and/or in the case of other plasma treatment parameters, as described previously.

Figure 3:
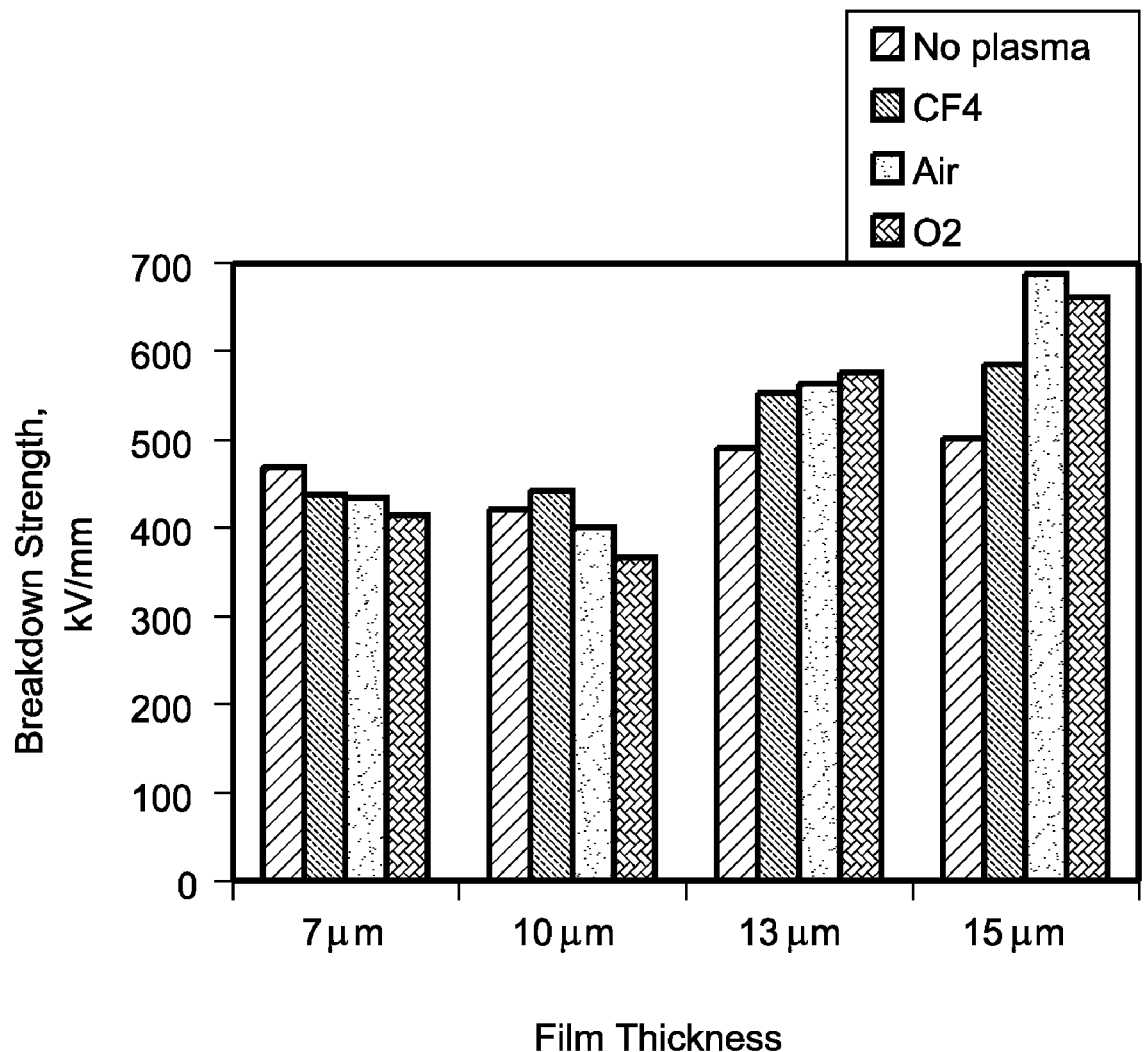
FIG. 3 is a plot of the polymer film thickness versus breakdown strength, in accordance with one aspect of the invention.

FIG. 3 shows the breakdown enhancement from plasma treatment, using different plasma gas types and polyetherimide substrate thicknesses. Thin polyetherimide sheets (Ultem® polymer from SABIC Innovative Plastics) of three thicknesses (7, 10, 13, 15 micrometer) were plasma treated using $CF_4$ gas employing the process described above. Samples were loaded into the plasma treatment chamber, one sample at a time. The chamber was pumped down, and after a base pressure was attained, the plasma source was ignited and turned off after a set amount of time. Other plasma parameters were held constant during the experiments. The plasma gas was flowed through the reactor at a flow rate of about 250 Standard cubic centimeters per minute. The RF power of about 250 watts was applied to the bottom electrode in an RIE mode. The electrodes were heated to 100° C., but had been set to a constant of about 25° C. and the wall temperature. The system pressure was maintained at 100 mTorr. The plasma treatment time was held constant for about 30 sec for each sample. The gas plasma ($CF_4$, air and $O_2$) gases were examined. Each of the samples was then tested for breakdown strength as described above. One untreated sample for each polyetherimide substrate thickness was tested, which served as the comparative data. The breakdown strength as a function of the plasma gas type and the polyetherimide substrate thickness was plotted as shown in FIG. 3.

From FIG. 3, it was observed that, for the thinner polyetherimide substrates, the plasma treatment did not result in the enhancement of the breakdown strength. (This may have been due to the effect of the plasma upon the bulk of a thinner material, perhaps causing some material degradation. It's possible that the treatment's effectiveness at these thicknesses can be enhanced by a change in polymer-type, or a change in other plasma treatment parameters, as noted previously). However the enhancement of the breakdown strength was observed for the thicker (13 and 15 micrometer) polyetherimide substrates. A breakdown strength enhancement of about 700 kilovolts per millimeter was observed when oxygen was the plasma gas, with the thicker (13 and 15 micrometer) polyetherimide substrates.

While the invention has been described with reference to exemplary embodiments, it will be understood by those skilled in the art that various changes may be made, and equivalents may be substituted for elements thereof, without departing from the scope of the invention. In addition, many modifications may be made to adapt a particular situation or material to the teachings of the invention, without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for increasing the dielectric breakdown strength of a polymer, comprising:
providing the polymer, wherein the polymer is selected from the group consisting of a polymer having a glass transition temperature of at least about 150° C.; and a polymer composite comprising at least one inorganic constituent; and
contacting a surface of the polymer in a reaction chamber with a gas plasma formed from at least one feedstock gas selected from the group consisting of oxygen, carbon tetrafluoride, nitrogen, air, ammonia, hydrogen, argon and helium, wherein the feedstock gas is directed to the surface of the polymer at a flow rate of at least about 1 standard cubic centimeter per minute to about 10,000 standard cubic centimeters per minute;
wherein the contact with the gas plasma is carried out for a period of time sufficient to incorporate additional chemical functionality into a surface region of the polymer film, to provide a treated polymer;
wherein the treated polymer has a dielectric breakdown strength which is at least 0.1 percent (%) greater than the dielectric breakdown strength of an untreated polymer.

2. The method of claim 1, wherein the gas plasma comprises oxygen.

3. The method of claim 1, wherein the flow rate of the gas plasma is in the range of from about 200 standard cubic centimeters per minute to about 7000 standard cubic centimeters per minute.

4. The method of claim 1, wherein contact of the polymer surface with the gas plasma is carried out by a plasma enhanced chemical vapor deposition technique.

5. The method of claim 1, wherein the polymer has a glass transition temperature of at least about 200° C.

6. The method of claim 1, wherein the polymer is at least one selected from polyetherimides, polysulfones, polyvinyledinedifluorides, polyvinylidenehexafluorides, polyphenylenesulfides, polyimides, polyarylethers, polyethersulfones, cyanoethyl cellulose, siloxane imide polymers, and copolymers thereof.

7. The method of claim 1, wherein the polymer composite comprises at least one polymer selected from polypropylene, polyethylene, polycarbonate, polyether, polyesters, polyphenylenesulfide, polyvinylidene difluoride, polyvinyl chloride, and copolymers thereof.

8. The method of claim 1, wherein the inorganic constituent is at least one selected from ferroelectric materials, barium titanate, boron nitride, aluminum oxide, strontium titanate, barium strontium titanate, alumina, titania, zirconia, magnesia, zinc oxide, cesium oxide, yttria, silica, lead zirconate, or lead zirconate titanate.

9. The method of claim 1, wherein contact of the polymer surface is carried out in the reaction chamber at a temperature in the range from about 25° C. to about 200° C.

10. The method of claim 1, wherein contact of the polymer surface is carried out in the reaction chamber at a pressure in the range from about 0.1 milliTorr to about 15 Torr.

11. The method of claim 1, wherein the surface region of the polymer film extends from the surface of the polymer to a depth of at least about 1 nanometer.

12. An article made from the method of claim 1.

13. The article of claim 12, wherein the article comprises a polymer having an energy density in the range from about 3 Joules per cubic centimeter to about 50 Joules per cubic centimeter.

14. An article having an energy density in the range from about 3 Joules per cubic centimeter to about 50 Joules per cubic centimeter, made by the method comprising:
providing the polymer wherein the polymer is selected from the group consisting of a polymer having a glass transition temperature of at least about 150° C., and a polymer composite comprising at least one inorganic constituent;
contacting a surface of the polymer in a reaction chamber with a gas plasma formed from at least one feedstock gas selected from the group consisting of oxygen, carbon tetrafluoride, nitrogen, air, ammonia, hydrogen, argon and helium, wherein the feedstock gas is directed to the surface of the polymer at a flow rate of at least about 1 standard cubic centimeter per minute;

wherein the contact with the gas plasma is carried out for a period of time sufficient to incorporate additional chemical functionality into a surface region of the polymer film, to provide a treated polymer;

wherein the treated polymer has a dielectric breakdown strength which is at least about 0.1 percent greater than the dielectric breakdown strength of an untreated polymer.

15. The article of claim 14, wherein the polymer is at least one selected from polyetherimides, polysulfones, polyvinyledinedifluorides, polyvinylidenehexafluorides, polyphenylenesulfides, polyimides, polyarylethers, polyethersulfones, cyanoethyl cellulose, siloxane polyetherimides, and copolymers thereof.

16. The article of claim 14, in the form of a capacitor having two conductors separated by a dielectric material, wherein the dielectric material comprises the treated polymer.

17. The article of claim 14, wherein the inorganic constituent is at least one selected from ferroelectric materials, barium titanate, boron nitride, aluminum oxide, strontium titanate, barium strontium titanate, alumina, titania, zirconia, magnesia, zinc oxide, cesium oxide, yttria, silica, lead zirconate, or lead zirconate titanate.

18. The article of claim 14, wherein the polymer composite comprises at least one polymer selected from polypropylene, polyethylene, polycarbonate, polyether, polyesters, polyphenylenesulfide, polyvinylidene difluoride, polyvinyl chloride and copolymers thereof.

19. The article of claim 14, having dimensions of about 10 centimeters to about 10,000 cm in length, about 10 to about 200 cm in width, and about 1 to about 20 microns in thickness.

20. A capacitor having an energy density in the range from about 3 Joules per cubic centimeter to about 50 Joules per cubic centimeter, made by the method comprising:

providing the polymer wherein the polymer is selected from the group consisting of a polymer having a glass transition temperature of at least about 150° C. and a polymer composite comprising at least one inorganic constituent;

contacting a surface of the polymer in a reaction chamber with a gas plasma formed from at least one feedstock gas selected from the group consisting of oxygen, carbon tetrafluoride, nitrogen, air, ammonia, hydrogen, argon and helium, wherein the feedstock gas is directed to the surface of the polymer at a flow rate of at least about 1 standard cubic centimeter per minute;

wherein the contact with the gas plasma is carried out for a period of time sufficient to incorporate additional chemical functionality into a surface region of the polymer film, to provide a treated polymer;

wherein the treated polymer has a dielectric breakdown strength which is at least about 0.1 percent (%) greater than the dielectric breakdown strength of an untreated polymer.

21. An article, having dimensions of about 10 cm to 10,000 cm in length, about 10 cm to 200 cm in width, and about 1 micron to about 20 microns in thickness, and having an energy density in the range of about 3 Joules per cubic centimeter to about 50 Joules per cubic centimeter, wherein the article comprises (I) at least one polymer having a glass transition temperature of at least about 150° C.; or (II) a polymer composite containing at least one inorganic constituent; and wherein the article contains at least one surface with a surface region which comprises chemical functionality which is different from chemical functionality present in the polymer or polymer composite; and wherein the article is characterized by a dielectric breakdown strength which is at least about 0.1 percent (%) greater than the dielectric breakdown strength of the same article which does not contain the differing chemical functionality.

\* \* \* \* \*